United States Patent
To et al.

(10) Patent No.: US 6,556,022 B2
(45) Date of Patent: Apr. 29, 2003

(54) METHOD AND APPARATUS FOR LOCAL PARAMETER VARIATION COMPENSATION

(75) Inventors: Thomas To, Folsom, CA (US); Jen-Tai Hsu, El Dorado Hills, CA (US); Andrew M. Volk, Granite Bay, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/895,290

(22) Filed: Jun. 29, 2001

(65) Prior Publication Data

US 2003/0006781 A1 Jan. 9, 2003

(51) Int. Cl.$^7$ .............................................. G01R 27/00
(52) U.S. Cl. ...................................... 324/600; 327/513
(58) Field of Search ................................ 324/600, 601, 324/605, 606; 327/543, 158, 236, 362, 512, 515, 513, 530–560

(56) References Cited

U.S. PATENT DOCUMENTS

| | | | | |
|---|---|---|---|---|
| 5,087,829 A | * | 2/1992 | Ishibashi et al. | 307/269 |
| 5,166,559 A | * | 11/1992 | Ishihara | 307/491 |
| 5,691,703 A | * | 11/1997 | Roby et al. | 340/628 |
| 5,880,612 A | * | 3/1999 | Kim | 327/158 |
| 5,889,431 A | * | 3/1999 | Csanky | 327/543 |
| 5,917,356 A | * | 6/1999 | Casal et al. | 327/236 |
| 6,025,792 A | | 2/2000 | Smith | 341/155 |
| 6,144,218 A | | 11/2000 | Smith et al. | 326/32 |
| 6,150,862 A | | 11/2000 | Vikinski | 327/262 |
| 6,177,788 B1 | | 1/2001 | Narendra et al. | 323/315 |
| 6,292,016 B1 | * | 9/2001 | Jefferson et al. | 326/39 |
| 6,324,084 B1 | * | 11/2001 | Fujisawa | 363/127 |

* cited by examiner

*Primary Examiner*—N. Le
*Assistant Examiner*—Etienne P LeRoux
(74) *Attorney, Agent, or Firm*—Blakley, Sokoloff, Taylor & Zafman LLP

(57) ABSTRACT

In order to detect performance parameter variations at different locations, local parameter detectors are located at the various local locations. One of the local locations is selected as the reference location while the other local locations are selected as destination locations. The reference location is utilized to determine a reference parameter value, while each destination location compares its local parameter value to the reference parameter value. The parameter values are current encoded and the reference parameter value is sent to the other locations for the comparisons. The comparison at the destination locations each generates a corrective signal to compensate for the difference in the parameter value between the locations. Parameter compensation is provided to reduce performance skew among the distributed locations.

20 Claims, 5 Drawing Sheets

METHOD AND APPARATUS FOR LOCAL PARAMETER VARIATION COMPENSATION

FIELD OF THE INVENTION

The present invention relates to the field of compensation circuits and, more particularly, to a method and apparatus to compensate for local process, voltage, and temperature variations.

BACKGROUND OF THE RELATED ART

In some precision circuit operations, process, voltage and temperature (PVT) variations can affect circuit performance, such as timing skew. For example, on a semiconductor die, deviations in a fabrication process and/or variations in circuit operation may result in PVT variations of varying quantity across the die. These variations then could produce local variations in circuit performance.

In an attempt to provide PVT compensation, a PVT sensing technique could use a PVT sensor to obtain an average PVT information for the die. For example, a global PVT sensor can route a detection path around the die and obtain the average environment condition. However, this technique fails to separately sense and compare the local variations. Global compensation techniques do not differentiate among the local sensed regions.

As an example, a circuit employing a phase lock loop (PLL) will consume substantially more power and generate more heat than a less active circuit. Thus, a region of the die at the PPL site will have a higher local temperature than some other region of the die and this temperature difference can result in a temperature gradient. A global temperature sensing technique would fail to localize this hotter location, since it would ascertain the average parameter. If a global PVT sensor is used, PVT compensation would be based on a global average and a true indication of the region about the PLL circuit would not be readily available. In application, a distributed clock signal which is typically buffered at various localized buffer locations, may deviate more than the allowable tolerance at a given buffer location due to the PVT variation at that location. The PVT differential at two given locations may be sufficient to introduce unacceptable timing skew between the two locations. A localized PVT compensation technique would allow for PVT compensation to be achieved at the local level.

DETAILED DESCRIPTION OF THE INVENTION

The present invention utilizes a number of local detectors located at various locations to sense or detect one or more local parameters. One of the local locations is selected as the reference location while the other local locations are selected as destination locations. The reference location is utilized to determine a reference value for the particular parameter or parameters, while each destination location compares its local parameter value to the reference value and generate a corrective signal to compensation for the difference at the destination location. Variations in a given parameter value between the reference location and a designated destination location determine the amount of compensation necessary at the destination location to adjust for any potential performance variation, such as timing skew, between the operative performance at the two locations.

Figure 1:
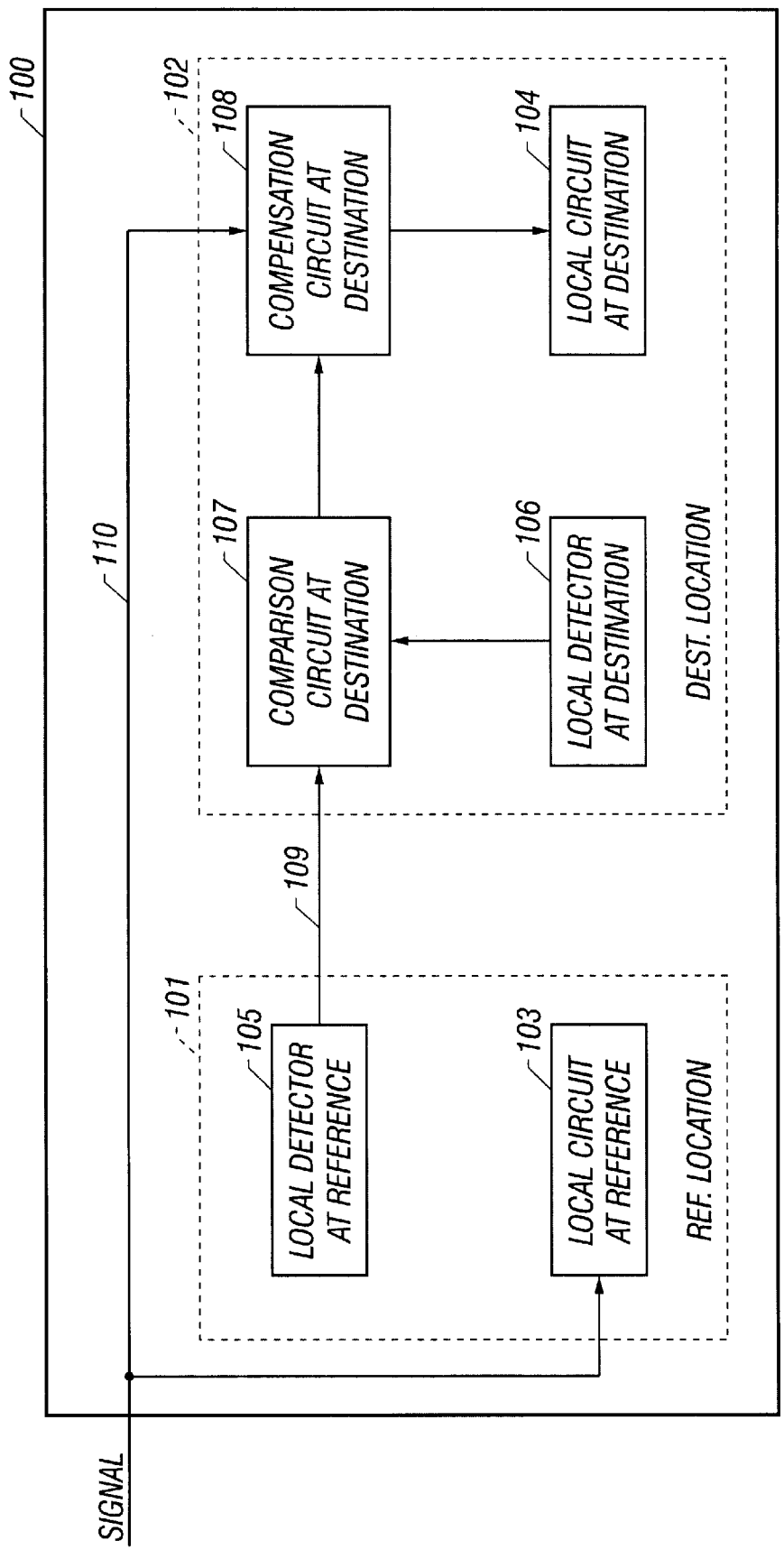
FIG. 1 is a block schematic diagram showing an embodiment of the invention in which local detection of a circuit parameter value is obtained at a reference location and at a destination location, in which the detected information is transmitted to the destination location and compared to the detected information at the destination location to generate a compensating signal to adjust or compensate a circuit at the destination location.

An example embodiment to practice the present invention is illustrated in FIG. 1. In the embodiment of FIG. 1, a semiconductor die 100 is shown in which a portion of the die 100 is noted as a reference location 101 while a second location is designated as a destination location 102. The two locations 101, 102 are physically located at separate regions of the die 100. A local operative circuit 103 is located at the reference location 101, while a local operative circuit 104 is located at the destination location 102. Similarly, a local detector 105 is located at the reference location 101, while a local detector 106 is located the destination location 102. The local circuits 103 and 104 can perform the same function or alternatively the circuits can perform different functions. The local detector 105 at the reference location 101 is associated with the local circuit 103 and detects a local parameter value which affects the performance of the local circuit 103. Equivalently, the local detector 106 at the destination location 102 is associated with the local circuit 104 and it detects the same local parameter value which affects the performance of the local circuit 104.

The detection by each of the detectors 105, 106 pertains to one or more parameters associated with the operation of the corresponding operative circuits 103, 104. In the particular embodiment described herein, the circuit parameter actually comprises three parameters. The three parameters which affect circuit operation and, hence, circuit performance, are process voltage and temperature (PVT) variations. Although each can be sensed individually, the embodiment described herein senses the PVT variations and generates a single combined parameter variation signal for the PVT variations.

Typically for circuit implementation, a nominal PVT value is associated with a given circuit for normal operation of that circuit. However, due to various factors, which may include design variations, variations introduced at time of manufacture, or variations in the operating environment during operation of the circuit, the circuit or components of the circuit may deviate from the nominal PVT value. Therefore, process, voltage and/or temperature parameters may vary from location to location. On a semiconductor die, such as a silicon wafer, P, V, and/or T values may be different for circuits at two locations, even if the circuits are identical in design. That is, localized factors can combine to vary the PVT value from the nominal.

In the example circuit, the combined PVT parameter values associated with each of the operative circuits 103, 104 may be different. The difference may be sufficient to introduce a performance skew, such as a timing skew, between the two circuits. The performance skew can affect the operation of the circuits 102, 103 themselves and/or other circuits coupled to or receiving signals from the circuits 103, 104.

In order to sense or detect the PVT parameters for comparison, local detectors 105, 106 are used to detect a variation in the PVT parameter value at each of the corresponding locations 101, 102. Thus, at the reference location 101 the local detector 105 detects a PVT parameter, which would affect the performance of the local circuit 103. Likewise, at the destination location 102 its local detector 106 detects a PVT parameter for location 102, which would affect the performance of the local circuit 104. The location 101 is referred to as the reference location, since the PVT value detected by the local detector 105 is used as a reference sense signal. The reference signal is then transmitted to the destination location 102, in which a comparison circuit 107 at the destination location 102 compares the two detected PVT parameters. A signal line 109 is shown coupling the detected PVT parameter signal from the local detector 105 to the comparison circuit 107.

The comparison circuit 107 also receives the detected PVT parameter signal from the local detector 106. The two sense signals are then compared by the comparison circuit 107 to determine if the two PVT parameter values are different. That is, the comparison circuit 107 detects the variation in the two parameter values between the reference location 101 and the destination location 102. The comparison circuit 107 then generates a corrective signal, which is coupled to a compensation circuit 108, also shown located at the destination location 102. The compensation circuit 108 then generates a compensation signal which provides the compensation or adjustment needed for the local circuit 104, so that operational variations between the two circuits 103, 104 caused by PVT variation are compensated.

Functionally, the embodiment described detects variations in the PVT parameter between the reference location 101 and the destination location 102. The PVT parameter detection at the reference location 101 is sent to the destination location 102 and compared to the detected PVT parameter at the destination location 102. The PVT variation between the two locations is noted and appropriate compensation is provided at the destination location 102.

In the particular example of FIG. 1, a signal is shown coupled to the local circuits 103, 104 on line 110. In a situation where circuit performance could be affected by the PVT differential between the two locations 101, 102, the compensation technique of the present invention would allow for the correction of the performance error. For example, if the signal on line 110 is a clock signal and the local circuits 103 and 104 includes buffers to utilize the clock signal, then PVT variations between the two locations 101, 102 could introduce performance skew in the clock buffers. The result could be a timing skew, so that the clock signals from the buffers in the two circuits 103, 104 are not synchronized. If more than nominal skew is introduced in the timing of the clock signals in the circuits 103, 104 then appreciable performance error can be introduced. However, when a compensation scheme is utilized, the PVT parameter variation between the two locations 101, 102 can be detected and appropriate corrective measures can be effected.

It is to be noted that the particular embodiment in FIG. 1 is described in reference to having a reference location 101 and one destination location 102 on a semiconductor die 100. As will be noted below, a number of destination location can be implemented. Furthermore, the practice of the invention need not be limited to a semiconductor die. Accordingly, the reference location 101 and the destination location 102 could be designated as two locations on a circuit board. For example, reference location 101 could be one chip located on a circuit board while destination location 102 could designate a second chip located at a different location on a circuit board. As a further example, the two locations 101 and 102 could represent two different circuits or devices of a system where there may be substantial physical separation between the two locations. Some of these embodiments will be described below. Thus, the present invention need not be limited for use strictly on a substrate or a semiconductor chip.

Figure 2:
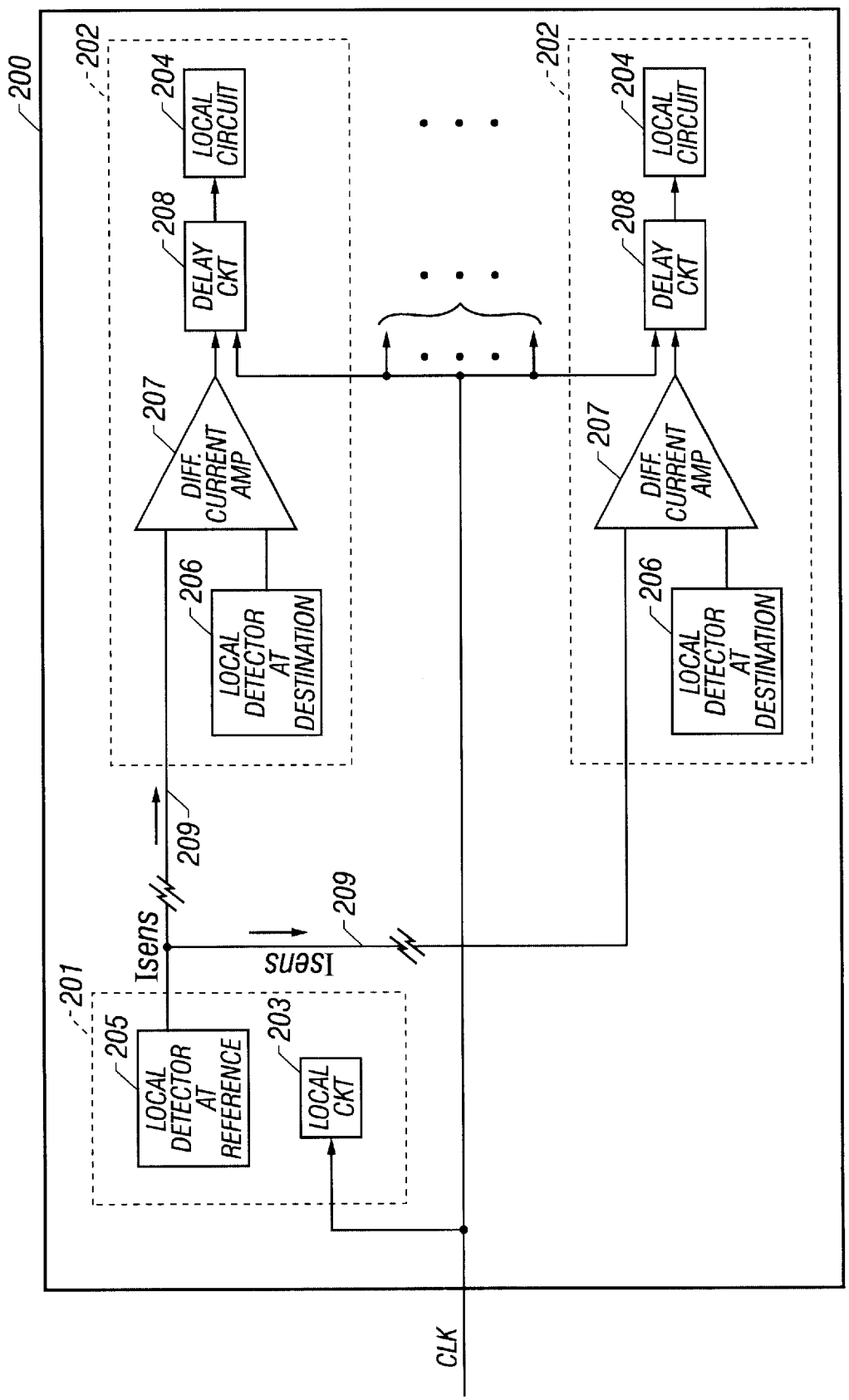
FIG. 2 is a block schematic diagram showing an embodiment of the invention in which local detection of a circuit parameter value is obtained at a reference location and at a number of destination locations, in which the detected information is transmitted to the destination locations as a current signal and compared to the detected information at the destination locations to generate a compensating signal to adjust or compensate a circuit at the respective destination locations.

Referring to FIG. 2, another embodiment of the present invention is shown. In this particular embodiment, a semiconductor die 200 is shown having a plurality of PVT parameter detection at various locations distributed on the die 200. One location is selected as a reference location 201 while the remaining locations are noted as destination locations 202. In this example, a plurality of destination locations 202 are shown coupled to the reference location 201. The actual number of destination locations 202 present will depend on the number of local detections desired, which may be determined by the number of local circuits requiring PVT parameter compensation.

The reference location 201 includes a local circuit 203 and a local detector 205. Circuit 203 and detector 205 are functionally equivalent to respective units 103, 105 of FIG. 1. That is, the PVT parameter associated with the local circuit 203 is detected by the local detector 205, which detector 205 then generates a signal corresponding to the detected PVT parameter value.

Equivalently, each of the destination locations 202 includes a local circuit 204, local detector 206, differential current amplifier 207, which function as a comparison circuit, and a delay circuit 208, which functions as a compensation circuit for the local circuit 204. Each grouping of units 204, 206, 207, 208 function equivalently to respective units 104, 106, 107, and 108 of FIG. 1.

The local detector 205 at the reference location 201 is used as the reference detector. The reference detector 205 determines a nominal biased condition for the combined PVT parameter value at the reference location where the local circuit 203 is located. This PVT parameter value is then used as the reference. The PVT condition at the reference location 201 is encoded and transmitted to each of the destination locations on line 209. The encoded signal is noted as Isens in FIG. 2.

At each of the destination locations 202, the local PVT detection is performed by corresponding local detectors 206. The PVT detection at each of the destination locations 202 pertains to the corresponding local circuitry 204 present at the respective destination location 202. In the particular embodiment shown, each of the local detectors 205, 206 detect a biased condition associated with the PVT parameter and then encodes the biased condition in an analog manner to generate a corresponding analog current. The analog current from the local detector 205 is noted as Isens to signify a sense current. The differential current amplifier 207 at each of the destination locations 202 receives the Isens signal on line 209. The Isens signal is coupled to one input of each differential amplifier 207 for use as a reference value. Isens is compared to the encoded current value from the respective local detector 206. The difference between the local PVT detected value and the referenced current value Isens is noted at the output of the differential amplifier 207.

In the embodiment described in FIG. 2, it is to be noted that line 209 is a typical electrical connection utilized in an integrated circuit manufactured on a substrate such a silicone substrate. Accordingly, line 209 is usually fabricated as a metal line with some amount of resistance present in the line. When the distance to the destination is of sufficient length, a voltage drop (I×R) can result. If the reference PVT parameter value was encoded utilizing voltage mode sensing, it is possible that the resistance of the line 209 could introduce a voltage drop of the encoded reference signal. Furthermore, if the electrical distance of the metal line from the reference detector 205 to the destination locations 202 varied sufficiently, then the reference PVT parameter encoded signal reaching the destinations may also vary due to the variation in the voltage drops.

In order to insure that voltage drop(s) along line 209 will not introduce incorrect encoded values for the reference PVT, the embodiment in FIG. 2 encodes the reference PVT using current mode sensing. Thus, the reference detector 205 encodes the detected PVT value into an analog current to ensure that any voltage drop along line 209 will not substantially change the encoded value. Due to charge conservation on line 209, the encoded current will retain the correct encoded value, even where metal line resistance introduces a voltage drop between the reference and destination locations. Accordingly, analog encoding of the reference PVT value for transmission to the differential amplifier located at each of the destination locations 202 will ensure that the actual reference PVT value is received by each of the destination locations 202.

Each local detector 206 at the respective destination location 202 generates its own PVT parameter value using the same current sensing mode. Thus, an encoded current is output from each detector 206. The differential amplifier 207 compares the local encoded current value to Isens to determine the amount of the difference between the two corresponding PVT values. Any variation is noted at the output of the differential amplifier 207 and coupled to the compensation circuit, which is in the form of a delay circuit 208 in the embodiment of FIG. 2.

Although a variety of compensation circuits could be utilized, the delay circuit 208 is used in the example to illustrate how clock skew is compensated. Thus, in the circuit of FIG. 2, a clock signal CLK is shown coupled to each of the locations noted. This example is utilized to illustrate a situation similarly noted above, in which clock buffers are distributed throughout a chip in order to generate timing signals for circuits located proximal to each buffer. Thus, each of the local circuits 203, 204 shown includes a clock buffer and, generally, any other circuitry controlled by the timing of the clock signal from the buffers. When PVT variations are distributed through out the various local circuits, clock timing skew can be introduced due to these PCT variations. However, by implementing the present invention in the embodiment shown in FIG. 2, the PVT variations can be compensated locally at each destination location 202. In the example, clock skew is adjusted by a corrective signal coupled to the delay circuit 208 to either increase or decrease the timing of the clock signal at each destination, so that the timing of the clock signals at each of the destination locations 202 are brought more in synchronization to the reference location 201.

Thus, the timing of the clock signals at each of the local circuit 204 will occur without significant timing skew, which could affect circuit performance. Where a local circuit 203 is present, the timing of each of the destination location circuits 204 will be in proper timing relation to the referenced circuit 203. Accordingly, any timing skew introduced due to PVT variations at various locations on the die are compensated by adjusting the timing of the clock signal at each of the destination locations 202.

Again as noted previously, the reference location 201 is typically selected at a location on the die where consistent nominal PVT values are experienced. Thus, the reference location would not include or be adjacent to circuits introducing significant PVT variations, such as a high heat producing phase lock loop circuit. The reference locations selected need not include a local circuit, as shown by circuit 203 in FIG. 2, but instead need only include a local detector for detecting the condition of the PVT parameter at the reference location.

Furthermore, it is to be noted again that although a die 200 is exemplified in the embodiment of FIG. 2, the distributed locations for the reference and destination locations can be on other platforms such as circuit boards, equipment, or distributed components of a system. Although a variety of circuits can be designed to perform the functions of the local detector 205, 206, FIG. 3 exemplifies one such embodiment.

Figure 3:
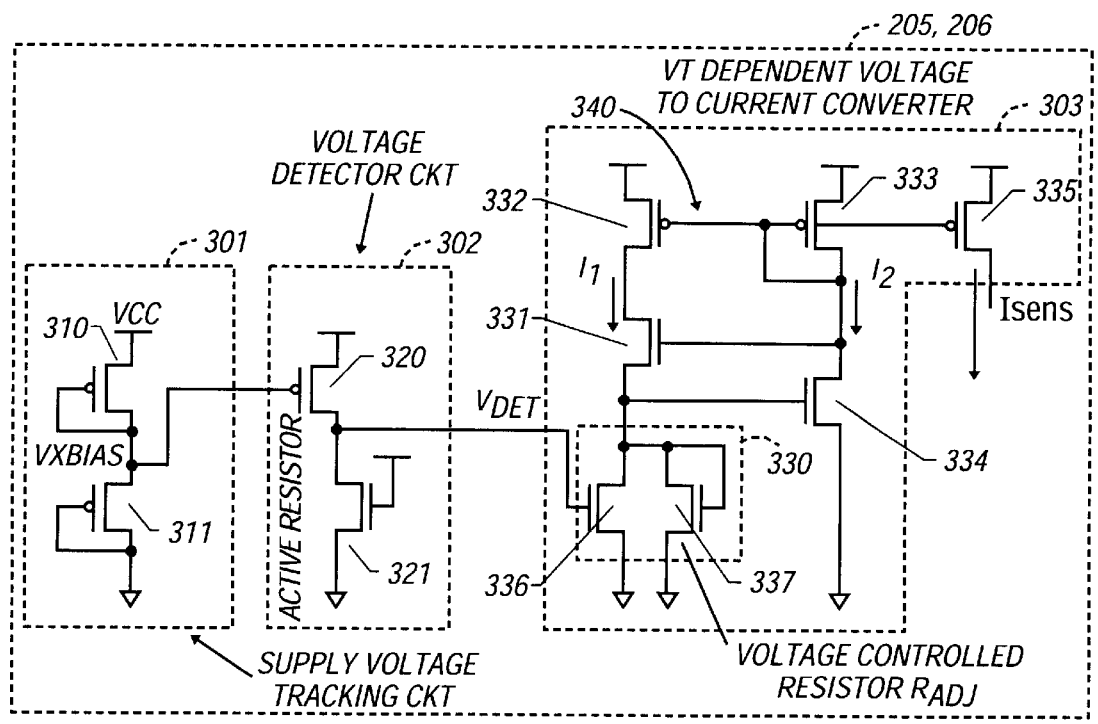
FIG. 3 is a circuit schematic diagram showing one embodiment to implement a local detector at the reference and destination locations.

Referring to FIG. 3, the detector 205, 206 is comprised of three subunits 301, 302, and 303. The circuit 301 is a supply voltage tracking circuit. The circuit 302 is a voltage detector circuit. The circuit 303 is a threshold voltage ($V_T$) dependent voltage-to-current converter which outputs the encoded current Isens. The supply voltage tracking circuit 301 tracks the supply voltage so that any variations in the supply voltage are felt at its output. In the particular embodiment shown the supply voltage tracking circuit 301 is comprised of two transistors 310 and 311, coupled in series between the supply voltage (Vcc) and its return (Vss), which is shown as a ground in the schematic. The two transistors operate essentially as a voltage divider network so that a biased voltage Vxbias is noted at the junction of the two transistors 310, 311. Since the two transistors operate as a voltage divider network, any supply voltage variation is noted by a change in the biased voltage Vxbias, which is coupled as an input to the voltage detector circuit 302.

It is appreciated that in the shown diagram, two P-type metal-oxide-semiconductor (MOS) transistors are used. However, a variety of other voltage divider networks or other supply voltage tacking circuitry could readily be utilized. For example, in another embodiment two resistors could be utilized in place of transistors 310 and 311. What is needed is a bias voltage which value corresponds to the supply voltage. Any variation in the value of the supply voltage Vcc will be reflected in the corresponding change in the bias voltage Vxbias and coupled as an input to the voltage detector circuit 302.

The Vxbias voltage is a voltage encoded signal which tracks the variation in the supply voltage Vcc. Since the value of the Vxbias voltage may not be of sufficient magnitude to drive the current converter circuit 303, the voltage detector circuit 302 is placed in between circuits 301 and 303 in order to amplify Vxbias. Thus, the voltage detector circuit 302 is utilized as a buffer amplifier to buffer and amplify the Vxbias voltage.

The voltage detector circuit 302 is comprised of two transistors 320 and 321 in series between Vcc and its return, which is ground in this instance. The Vxbias voltage from the supply voltage tracking circuit 301 is coupled to the gate of transistor 320, which is a P-type transistor in this instance. The other transistor 321 is an N-type transistor and functions as an active resistor. The amplification is achieved by transistor 320 in which the output at the junction of the two transistors 320, 321 is noted as detected voltage $V_{DET}$. The signal Vxbias drives the gate of the transistor 320 so that the output $V_{DET}$ is an amplified Vxbias signal. The active resistor is represented by the transistor 321 in this instance, however an actual resistor could be used instead. As noted, the voltage detector circuit 302 buffers the Vxbias voltage, as well as amplifying it, to provide the output $V_{DET}$ from circuit 302. The $V_{DET}$ signal is a voltage encoded signal in which its value corresponds to Vcc, so that any variations of the supply voltage Vcc is noted by the amplified variations of $V_{DET}$.

The $V_{DET}$ signal is then coupled as an input to the $V_T$ dependent voltage-to-current converter circuit 303. The circuit 303 is comprised of a voltage controlled resistor 330 and a current mirror 340. The voltage controlled resistor 330 functions as an adjustable resistance in which the value of the resistance is determined by $V_{DET}$. Although a variety of devices can be used to provide an adjustable resistance, $R_{adj}$, the embodiment shown in FIG. 3 utilizes two transistors 336 and 337, which are coupled in parallel. The $V_{DET}$ input is coupled to the gate of the transistor 336 while the gate of the transistor 337 is coupled to the drain junction. In the particular embodiment, transistors 336, 337 are N-type MOS transistors. Functionally, the transistors 320, 321 provide a variable resistance which value is dependent on the gate drive of $V_{DET}$. As will be described below, the Radj is placed in one leg of a current mirror to adjust the value of the current on the drive side of the current mirror.

The second portion of the circuit for the voltage-to-current converter 303 is the current mirror 340. The current mirror is comprised of transistors 331, 332, 333, and 334. The transistors 331, 332 are in series with the voltage controlled resistor section 330 to form the drive side of the current mirror 340. Transistors 333, 334 are in series and coupled to the driven side transistors 336, 337 to form the driven side of the current mirror 340. As noted in the schematic of FIG. 3, the drive current is noted as $I_1$ while the driven current of the current mirror is noted as $I_2$. When the current mirror transistors are fabricated equivalently, the driven current $I_2$ would have the same value as the driver current $I_1$. Accordingly $I_1=I_2=I$ and, henceforth, the current mirror 336 current is noted as I in the description below. However, $I_2$ need not equal $I_1$ in certain designs and proportionate ratios between $I_2$ and $I_1$ can be designed with proper sizing of the driver and driven transistors of the current mirror 311. As noted in the particular embodiment shown in FIG. 3, transistors 331, 334 are N-type transistors while transistors 332, 333 are P-type transistors. An output transistor 335, which is a P-type transistor in this instance, is coupled to have the same gate drive as transistor 333 so that the current to transistor 335, which is Isens tracks the value of the current I.

In operation, the value of the current I is determined primarily by the properties of the cross coupled transistors 331, 334 and by the resistive value $R_{adj}$ of the adjustable resistor 310. Since the output current Isens mirrors the current I, any adjustments made to the current I results in a proportional adjustment in the output current Isens.

The operation of the voltage-to-current converter 303 is as follows. The converter 303 detects changes in all three of the PVT parameters, which are voltage variations, and encodes the voltage into an analog encoded current Isens. The supply voltage variation is tracked and amplified in the circuits 301 and 302 as was described above. The supply voltage variation is encoded in the input signal $V_{DET}$ which is coupled to the gate of the transistor 336. Any changes in the supply voltage are noted by corresponding changes in the $V_{DET}$, which adjust the gate drive of the transistor 336. The gate drive determines the amount of conduction of transistor 336, which in effect follows the signal $V_{DET}$, to control Radj, which changes the value of the current I and ultimately Isens. Accordingly, any supply variations tracked by the supply voltage tracking circuit 301 will manifest as corresponding variations in the current I and correspondingly in Isens. Thus, the V parameter is encoded into Isens by the control on Radj.

The encoding of the process and temperature parameter variations is achieved by the variations of the threshold voltage of the transistor 334. Assuming a 1 to 1 ratio of the current mirror so that I1 equals I2 (herein simply noted as I), the value of I will be dependent on the gate drive of the two transistors 331, 334 minus the threshold voltage $V_T$ of the transistor 334. The current I through the two branches of the current mirror is determined by $$I = (K/2)(V_{GS} - V_T)^2 \quad \text{(Equation 1)}$$

where,

K=Transconductance of the transistor 334;

$V_{GS}$=Gate-source voltage of the transistor 334; and the $V_T$ is the threshold voltage of the transistor 334.

Solving for VGS $$V_{GS} = V_T + \sqrt{\frac{2I}{K}} \quad \text{(Equation 2)}$$

Since VGS=I×R, $$IR = V_T + \sqrt{\frac{2I}{K}} \quad \text{(Equation 3)}$$

If K is made very large, so that the square root quantity is insignificant compared to IR, $$I = V_T/R \quad \text{(Equation 4)}$$

Since $V_T$ is a function of temperature and also of the process constructing the transistor, $V_T$ changes correspondingly as P and T parameters change. Since R is Radj, it is a function of the supply voltage as noted above. Accordingly, $$I = V_{T[T, P]}/R_{[V]} \quad \text{(Equation 5)}$$

As noted in Equation 5, the current I is a function of the threshold voltage of the transistor 334 and the resistance Radj of the voltage controlled resistor 330. Since Radj has a value dependent on the detected supply voltage, any changes in the supply voltage are translated into a corresponding change in the resistance of resistor circuit 330 and encoded into Isens.

The process and temperature parameter variations are tracked by corresponding variations in the threshold voltage $V_T$. That is, process differences during manufacturing affect the threshold voltage of the transistor so that the threshold voltage of a transistor, such as transistor 334, will track the process differences. Similarly, the operating temperature of the transistor will also change the threshold voltage of that transistor. Accordingly the threshold voltage $V_T$ of transistor 334 is a function of both temperature and process so that variations in temperature and process are reflected in the threshold voltage. Therefore, the current I will vary as a function of P and T variations.

As noted in Equation 5, temperature and process parameter variations will have direct proportional effect on the current I while supply voltage variations will have an indirect effect on current I. Since the output current Isens tracks current I, supply voltage variations as well as voltage variations corresponding to temperature and process parameters are reflected in the variation of the current Isens. Essentially, the analog voltage changes are translated into analog current changes in the converter circuit 303.

In order to construct the circuit 303 to perform the function described above, careful sizing and matching of the transistors of the current mirror are required, especially transistor 334. In order to ensure that the transconductance value K is large as possible (see Equation 3), characteristics of the transistor 334 can be determined and controlled as follows:

Since $$K = \mu_o C_{ox}\left(\frac{W}{L}\right) \quad \text{(Equation 6)}$$

where $\mu_o$ is carrier mobility; $C_{ox}$ is the gate oxide of the transistor; W is the width dimension; and L is the length dimension. Thus from Equation 6, K can be made large by adjusting one or more of the transistor properties.

However, in making K large, the current Isens should be of sufficient value to be above the noise value encountered in transit to the destination locations from the reference location. In one embodiment, the average value for Isens is selected to be at least one hundred microamps. Thus, by selecting proper characteristics for the transistors in the current mirror 340, process P and temperature T variations can be encoded into Isens by changes in $V_T$ of the transistor 334. Likewise, supply voltage variation encoding is provided by the adjustment in Radj.

Figure 4:
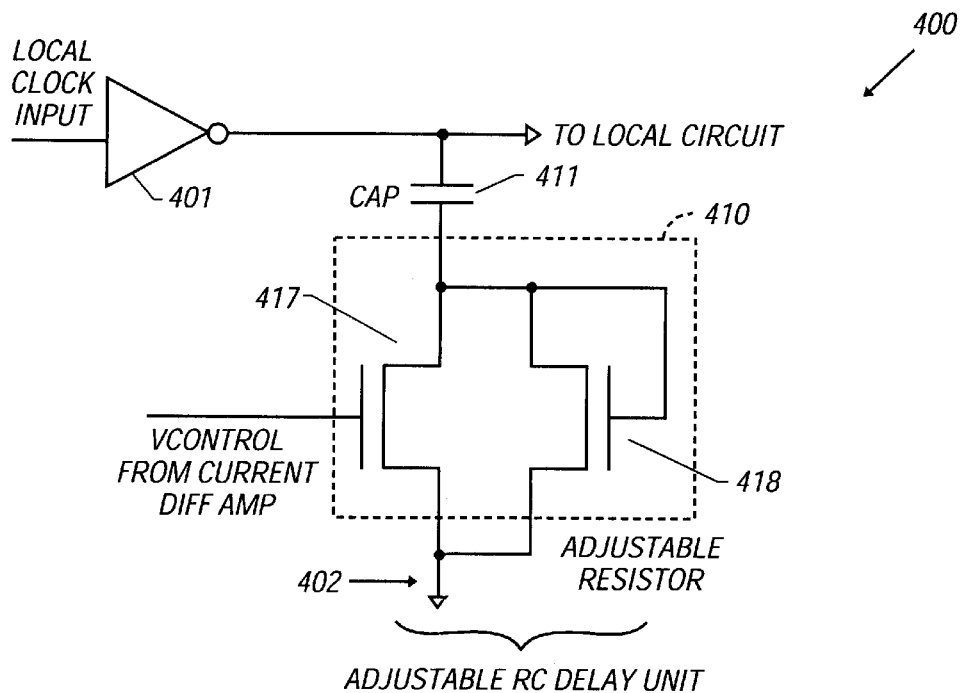
FIG. 4 is a circuit schematic diagram showing one embodiment for implementing a local delay circuit at the destination location or locations to adjust for timing skew caused by a variation between the reference and the given destination location(s).

Referring to FIG. 4, one embodiment of a circuit to implement the delay circuit 208 of FIG. 2 is shown. Delay circuit 400 is one implementation for the delay circuit 208 of FIG. 2. The delay circuit 400 is comprised of a buffer 401 and an adjustable RC delay unit 402. In reference to FIG. 2, a clock signal was distributed to a number of destination locations each having a delay circuit 208. The purpose of the delay circuit is to increase or decrease the delay timing of the clock signal coupled through the circuit 400. The amount of the delay is controlled by the output from the differential amplifier 207 shown in FIG. 2.

Accordingly, the clock signal at each destination location is input to the buffer 401, which is shown as an inverter in the particular example of FIG. 4. The adjustable RC delay unit 402 located at the output of the buffer adjusts the RC time constant so that the timing of the clock signal to the next circuit is either increased or decreased based on the corrective signal received from the output of the differential amplifier 207. In the particular example of FIG. 4, the adjustable RC delay unit 402 is comprised of an adjustable resistor 410 and a capacitor 411, coupled in series between the output of the inverter 401 and ground. The adjustable resistor includes two transistors 417 and 418 coupled similarly to the transistors 336 and 337 of FIG. 3. The adjustable resistor 410 functions equivalent to the adjustable resistor 330 in that the corrective signal from the output of the differential amplifier 207 is coupled to the gate of the transistor 417.

Thus, PVT variations noted between the reference location and the particular destination location are compared and a corrective signal generated when a difference is noted. The corrective signal is then used to control the amount of delay at the output of the delay circuit which is then coupled to the local circuit which is controlled by the clock signal. As noted in FIG. 2, when the delay is adjusted at each of the destination locations based on the PVT parameter variation noted between the reference signal and the PVT values at each destination location, proper adjustment or compensation is provided by the delay circuit in order that the clock signals at each of the destination locations are adjusted to the proper timing in reference to the reference clock signal.

Figure 5:
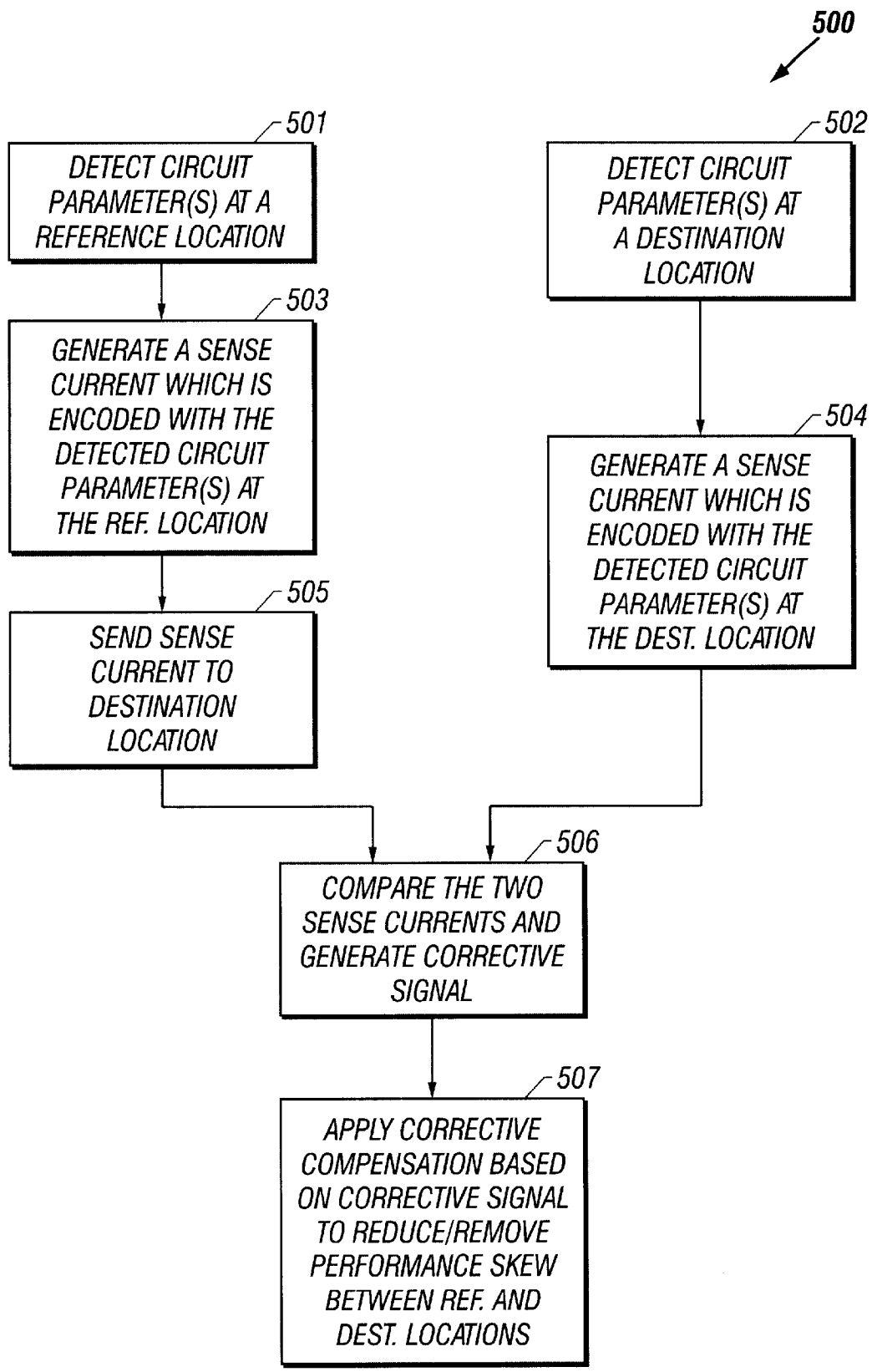
FIG. 5 is a flow diagram illustrating the method of the present invention to detect circuit parameter values at reference and destination locations, transmitting the encoded information from the reference location to the destination location, comparing the difference of the two parameter values, and providing a corrective signal to compensate at the destination location.

Referring to FIG. 5, a flow chart 500 illustrates a method of applying corrective compensation by the practice of the present invention. A circuit parameter or parameters, such as the PVT parameters described above, is detected at a reference location (block 501) and the same circuit parameter or parameters are detected at the destination location (block 502). Subsequently, a sense current is generated which is encoded with the detected circuit parameter at the reference location (block 503) as well as at the destination location (block 504). Then, the sense current from the reference location is sent to the destination location (block 505) and the two sense currents are compared to generate a corrective signal at the destination location (block 506). The corrective signal is used to apply a corrective compensation to reduce and/or remove performance skew caused by the difference in the parameter values between the reference and destination locations (block 507).

Two examples on how this can be achieved were described in reference to FIGS. 1 and 2. Furthermore, the number of destination locations may vary and in some instances a significant number of destination locations may be present. Although the invention described above is in reference to PVT parameters, the invention can be adapted to measure other circuit parameter or parameters. It need not be limited strictly to detecting PVT variations at different locations. Furthermore, the invention need not be made applicable only to a substrate or on a single die.

Figure 6:
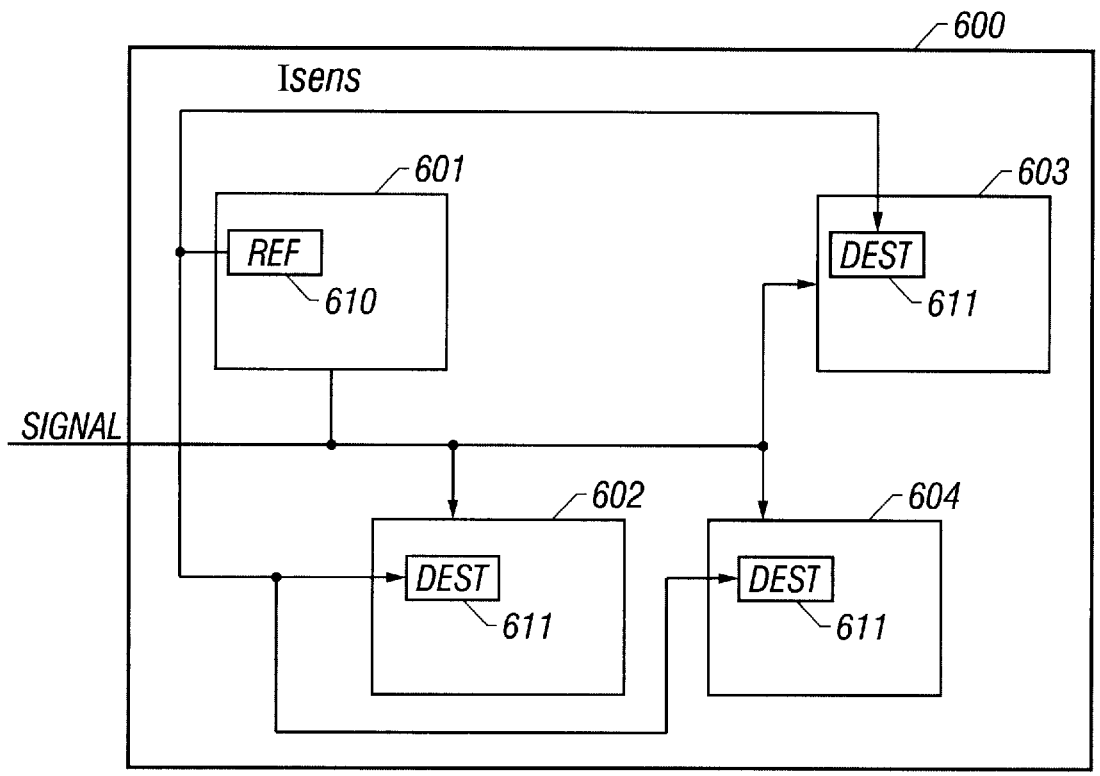
FIG. 6 illustrates one system embodiment to utilize the present invention.

Accordingly, as shown in FIG. 6, the invention could be implemented beyond the die. In FIG. 6, a circuit board 600 is shown comprised of several separate dice or chips. In the embodiment shown, four chips 601–604 are shown in which a signal is routed to all of the chips 601–604. The signal could be a clock signal as described in reference to FIG. 2. It could be other signals as well. In this instance, one device 601 is selected to have the reference location present while the other devices 602–604 are designated as the destination locations and contain detection and compensation circuitry. For example, if the routed signal is a clock signal equivalent to that shown in FIG. 2, the device 610 at the reference location 610 would include a local detector equivalent to detector 205 of FIG. 2. Likewise, the destination devices 602–604 would include circuitry 611 which would be equivalent to the destination location circuitry 202 of FIG. 2.

Figure 7:
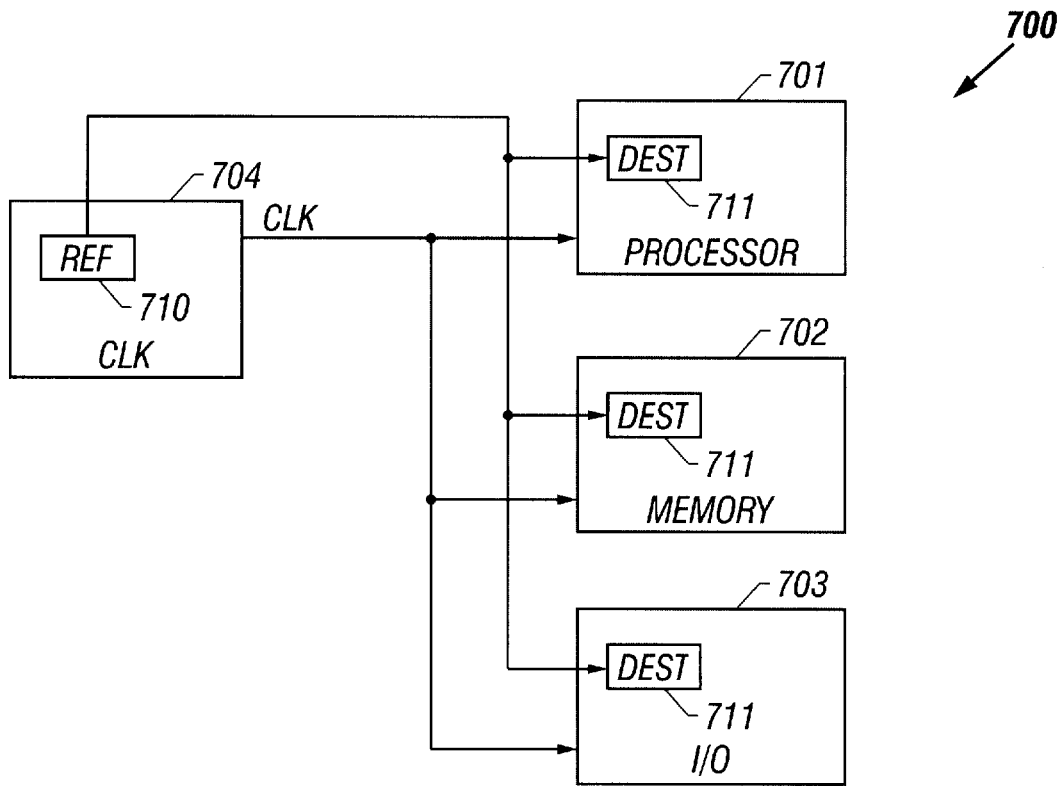
FIG. 7 illustrates another system embodiment to utilize the present invention.

In FIG. 7, the invention is enlarged further into a system comprised of various components which make up a system

700. In the particular embodiment shown, system 700 is comprised of a processor 701 memory 702 and input/output (I/O) device 703 all coupled to a clocking component 704. The clocking component 704 provides clock signals to the other units 701–703.

The embodiment of FIG. 7 is implemented having a reference detector in the clock 704, while destination detectors and compensation circuits are disposed in each of the components 701–703. The clock 704 is designated the reference location and includes the reference detector 710 for detecting PVT for establishing PVT values at the reference location. The encoded current signal is coupled to each of the destination locations wherein local detectors and compensation circuits at each destination location 711 determine the variation of the PVT value from the reference value and generate appropriate corrective signals to compensate the clock timing at each of the component locations 701–703. Thus, the invention can be implemented not only on a single chip but also on larger units and systems.

As noted in the description above, the embodiments described compensated for PVT parameter variations. However, compensation can be provided to other circuit parameters as well. A significant advantage is obtained in that the encoded signal transmitted from the reference location is a current signal so that voltage drops along the transmission line will not introduce error in the encoded value received at the destination locations. It is also to be noted that the embodiment described is in reference to an encoded current signal, but that other encoded signals can be implemented to practice the invention.

It is to be noted that the particular examples noted herein utilized a distributed clock signal which received appropriate compensation at various locations. However, the utilization of the invention need not be limited to such distributed signals. Compensation can be introduced at the various local locations to the circuitry present, even if the circuitry does not have a common distributed signal. The various other circuit elements, signals or functions can be readily adjusted based on the compensation provided.

Finally, although the invention is described in terms of hardware, the invention can be readily implemented utilizing software. For example, after obtaining the corrective value at the destination location, the value can be encoded into a digital value so that this digital value can then be used to adjust values which are controlled by software. Thus, software applications can be readily implemented with the practice of the present invention. As with such software, it can be readily stored on a storage medium which is machine readable.

Thus, a method and apparatus for local parameter variation compensation is described.

We claim:

1. An apparatus comprising:
    a first detector located at a first location to detect a reference parameter value associated with determination of process, voltage and temperature (PVT) values at the first location and to generate a first encoded signal indicative of the reference parameter value, the first encoded signal to have the PVT values encoded into an encoded analog current signal;
    a second detector located at a second location to detect a local parameter value associated with determination of PVT values at the second location and to generate a second encoded signal indicative of the local parameter value; and
    a comparison circuit located at the second location to receive the first and second encoded signals and to generate a corrective signal based on a difference of the local parameter value from the reference parameter value;
    a compensation circuit located at the second location to use the corrective signal to correct operation of an operative circuit at the second location.

2. The apparatus of claim 1 wherein the second encoded also to have the PVT values encoded into an encoded signal analog current signal.

3. The apparatus of claim 1 wherein the compensation circuit corrects for performance skew between operative circuits located at the first and second locations.

4. The apparatus of claim 1 wherein the compensation circuit corrects for timing skew between operative circuits located at the first and second locations, in which the timing skew is caused by the variation of the PVT values at the two locations.

5. The apparatus of claim 4 wherein the timing skew is corrected by a delay circuit which increases or decreases the timing of the operative circuit at the second location based on the corrective signal.

6. A semiconductor device comprising:
    a plurality of detectors distributed at various locations on a semiconductor die to detect a circuit parameter value at respective distributed locations, one of the locations identified as a reference location and others identified as destination locations, wherein the circuit parameter value at the reference location is selected as a reference parameter value, which is associated with determination of process, voltage and temperature (PVT) values at the reference location, and the circuit parameter values at the destination locations are destination parameter values associated with determination of respective PVT values at the respective destination locations, the detectors to generate respective encoded signals indicative of the respective parameter values, the encoded signal of the reference location being an encoded analog current signal;
    a plurality of comparison circuits, one at the respective destination locations to receive the encoded analog current signal from the reference location and to compare it to the encoded signal at the respective destination location and to generate a corrective signal based on a difference of the respective destination parameter value from the reference parameter value;
    a plurality of compensation circuits at the respective destination locations to use the corrective signal at the respective destination locations to correct operation of an operative circuit at the respective location.

7. The semiconductor device of claim 6 wherein the respective compensation circuits adjusts for performance skew between operative circuits located at the reference location and the respective destination locations.

8. The semiconductor device of claim 7 wherein the comparison circuits include differential comparators.

9. The semiconductor device of claim 7 in which the plurality of detectors, comparison circuits and compensation circuits are distributed at different regions of a wafer die where a common signal is present and the compensation is used at the respective destination locations to reduce performance skew caused by variations in the common signal.

10. The semiconductor device of claim 9 wherein one or more of the detectors includes:
    a voltage detector coupled to detect changes in a supply voltage; and
    a voltage to current converter coupled to the voltage detector to convert the detected change in the supply voltage into the encoded analog current, the converter also including a transistor in which its threshold voltage change is also encoded into the encoded analog current, in which the encoded analog current encodes changes noted in the supply voltage and threshold voltage to detect a circuit parameter change.

11. The semiconductor device of claim 10 in which the change of the threshold voltage of the transistor is used to detect process parameter and temperature parameter changes, and the coupled supply voltage to detect a supply voltage parameter change, the parameter changes encoded into the encoded analog current.

12. The semiconductor device of claim 11 wherein the voltage to current converter further includes a voltage controlled resistor coupled to a current mirror wherein the detected supply voltage change causes the resistor to vary its resistance which varies a current of the current mirror to encode the encoded analog current.

13. The semiconductor device of claim 10 further comprising a voltage tracking component coupled to the supply voltage and to the voltage detector to track the supply voltage for detection by the voltage detector.

14. The semiconductor device of claim 13 wherein the threshold voltage change causes the current of the current mirror to encode the encoded current.

15. A method comprising:
    detecting a circuit parameter value associated with determination of process, voltage and temperature (PVT) values at a first location;
    generating a first encoded signal, which encode is based on the first circuit parameter value, the first encoded signal being an encoded analog current signal;
    detecting a circuit parameter value associated with determination of PVT values at a second location;
    generating a second encoded signal, which encode is based on the second circuit parameter value;
    transferring the first encoded signal, to the second location;
    comparing the first and second encoded signals to determine a variation between the two encoded signals;
    generating a corrective signal based on the comparison of the two encoded currents;
    applying the corrective signal at the second location to an operative circuit to reduce performance skew between the two locations caused by differences in the parameter values at the two locations.

16. The method of claim 15 further including compensating the operative circuit at the second location by varying a signal delay to reduce the performance skew.

17. The method of claim 15 further having a plurality of second locations to compensate the performance skew at distributed locations on a semiconductor die.

18. The method of claim 15 wherein the generating a first and second encoded signal, generates both a first and second encoded analog current signals.

19. A system comprising:
    a plurality of components distributed in the system and the components including:
    a detector to detect a circuit parameter value at respective component locations, but with one of the components identified as a reference component and others identified as destination components, in which the circuit parameter value of the reference component is selected as a reference parameter value, which is associated with determination of process, voltage and temperature (PVT) values at the reference location, and the circuit parameter value of the destination components are destination parameter values also associated with determination of respective PVT values at the respective destination locations, the detectors to generate respective encoded signals indicative of its PVT values and in which the detector of the reference component generates an encoded analog current signal; and
    a plurality of comparison circuits at the respective destination component locations to receive the encoded analog current signal from the reference component and compare it to the encoded signals at the respective destination component locations and to generate a corrective signal for each destination component based on a difference of the respective destination parameter value from the reference parameter value.

20. The system of claim 19 wherein the respective components include a compensation circuit coupled to a respective comparison circuit to adjust a common signal routed to the destination components to reduce performance skew caused by variations in the common signal in the components.

* * * * *

UNITED STATES PATENT AND TRADEMARK OFFICE
CERTIFICATE OF CORRECTION

PATENT NO.     : 6,556,022 B2
DATED          : April 29, 2003
INVENTOR(S)    : To et al.

It is certified that error appears in the above-identified patent and that said Letters Patent is hereby corrected as shown below:

<u>Title page,</u>
Item [75], Inventors, after "Thomas To", insert -- Hing Yan To --.

Signed and Sealed this

Fourth Day of May, 2004

JON W. DUDAS
*Acting Director of the United States Patent and Trademark Office*